United States Patent
Wang et al.

(10) Patent No.: US 9,997,393 B1
(45) Date of Patent: Jun. 12, 2018

(54) METHODS FOR FABRICATING INTEGRATED CIRCUITS INCLUDING SUBSTRATE CONTACTS

(71) Applicant: Globalfoundries Singapore Pte. Ltd., Singapore (SG)

(72) Inventors: Yuzhan Wang, Singapore (SG); Bo Yu, Singapore (SG); Zeng Wang, Singapore (SG); Wensheng Deng, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days. days.

(21) Appl. No.: 15/616,143

(22) Filed: Jun. 7, 2017

(51) Int. Cl.
| H01L 21/74 | (2006.01) |
| H01L 21/285 | (2006.01) |
| H01L 21/311 | (2006.01) |
| H01L 21/768 | (2006.01) |
| H01L 21/3205 | (2006.01) |
| H01L 21/4763 | (2006.01) |

(52) U.S. Cl.
CPC ...... H01L 21/743 (2013.01); H01L 21/28518 (2013.01); H01L 21/311 (2013.01); H01L 21/3205 (2013.01); H01L 21/4763 (2013.01); H01L 21/76802 (2013.01); H01L 21/76816 (2013.01)

(58) Field of Classification Search
CPC .................. H01L 21/743; H01L 21/4763
See application file for complete search history.

(56) References Cited

U.S. PATENT DOCUMENTS

| 9,087,906 B2 | 7/2015 | Verma et al. |
| 2011/0278581 A1* | 11/2011 | Inoue .................... H01L 21/743 257/66 |
| 2016/0148991 A1* | 5/2016 | Erickson ........... H01L 21/02164 438/381 |

* cited by examiner

Primary Examiner — Mounir Amer
(74) Attorney, Agent, or Firm — Lorenz & Kopf, LLP (57) ABSTRACT

Methods for fabricating integrated circuits are provided. In one example, a method includes depositing an ILD layer overlying a SOI substrate including a device structure and an isolation structure. The device structure is disposed on a semiconductor layer of the SOI substrate and includes a metal silicide region and the isolation structure extends through the semiconductor layer to a buried insulator layer of the SOI substrate. A patterned mask is used for etching through the ILD layer and forming a device contact opening that exposes the metal silicide region and a substrate contact opening that exposes the isolation structure. A device contact is formed in the device contact opening. The isolation structure and the buried insulator layer are etched through to extend the substrate contact opening to a support substrate of the SOI substrate. A substrate contact is formed in the substrate contact opening.

19 Claims, 4 Drawing Sheets

METHODS FOR FABRICATING INTEGRATED CIRCUITS INCLUDING SUBSTRATE CONTACTS

TECHNICAL FIELD

The technical field generally relates to integrated circuits, and more particularly relates to methods for fabricating integrated circuits including silicon-on-insulator (SOI) substrates with substrate contacts.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit.

Certain improvements in the performance of MOS ICs can be realized by forming the MOS transistors in a thin layer of semiconductor material (semiconductor layer) overlying a buried insulator layer that overlies a support substrate (e.g., silicon substrate). Such semiconductor or silicon-on-insulator (SOI) MOS transistors, for example, exhibit lower junction capacitance and can operate at higher switching speeds than MOS transistors formed in bulk substrates. In SOI MOS transistors, the semiconductor layer, in which the source and drain regions are formed, is dielectrically encapsulated. In particular, the MOS transistors are typically enclosed in an interlayer dielectric material that overlies the semiconductor layer, which overlies the buried insulator layer. This configuration provides significant advantages but also give rise to certain issues.

One issue is the build up of static surface charges on the SOI substrate. In particular, the support substrate of the SOI substrate is typically not electrically connected to any other structure. The SOI substrate is "floating" over the support substrate due to the presence of the buried insulator layer; thus static surface charges may easily build up on the SOI substrate during IC fabrication and/or normal IC operation. These static charges may undesirably disturb the normal operation of the IC or devices in the IC. Further, current IC manufacturing approaches for grounding to prevent or minimize the build up of these static surface charges can involve a significant number of additional manufacturing processes including the use of additional etching masks, etching and/or deposition processes to create an electrical pathway(s) or substrate contact(s) for transporting static surface charges through the buried insulator layer between the semiconductor layer and the backside support substrate of the SOI substrate.

Accordingly, it is desirable to provide methods for fabricating integrated circuits including silicon-on-insulator (SOI) substrates with reduced manufacturing complexity and/or enhanced manufacturing efficiency for forming substrate contacts. Furthermore, other desirable features and characteristics of the present embodiment will become apparent from the subsequent detailed description and the appended claims, taken in conjunction with the accompanying drawings and this background.

BRIEF SUMMARY

Methods for fabricating integrated circuits are provided. In an exemplary embodiment, a method for fabricating an integrated circuit includes depositing an ILD layer of insulating material overlying a SOI substrate including a device structure and an isolation structure. The device structure is disposed on a semiconductor layer of the SOI substrate and includes a metal silicide region and the isolation structure extends through the semiconductor layer to a buried insulator layer of the SOI substrate. A patterned mask is used for etching through the ILD layer and forming a device contact opening that exposes the metal silicide region and a substrate contact opening that exposes the isolation structure. A device contact is formed in the device contact opening electrically coupled to the metal silicide region. The isolation structure and the buried insulator layer are etched through to extend the substrate contact opening to a support substrate of the SOI substrate. A substrate contact is formed in the substrate contact opening electrically coupled to the support substrate.

In accordance with another exemplary embodiment, a method for fabricating an integrated circuit is provided. The method includes forming a patterned mask that overlies an ILD layer of insulating material. The patterned mask includes a device contact pattern and a substrate contact pattern. The ILD layer overlies a SOI substrate that includes a device structure and an isolation structure. The device structure is disposed on a semiconductor layer of the SOI substrate and includes a metal silicide region. The isolation structure extends through the semiconductor layer to a buried insulator layer of the SOI substrate. The patterned mask is used to form a device contact opening and a substrate contact opening extending through the ILD layer aligned with the device contact pattern and the substrate contact pattern, respectively. The device contact opening exposes the metal silicide region and the substrate contact opening exposes the isolation structure. A first conductive material is deposited overlying the ILD layer to fill the device contact opening and partially fill the substrate contact opening. The first conductive material is etched back to expose the isolation structure in the substrate contact opening while leaving the device contact opening substantially filled with the first conductive material to define a device contact that is electrically coupled to the metal silicide region. The isolation structure and the buried insulator layer are etched through to extend the substrate contact opening to a support substrate of the SOI substrate. A second conductive material is deposited overlying the ILD layer to fill the substrate contact opening and form a substrate contact that is electrically coupled to the support substrate.

BRIEF DESCRIPTION OF THE DRAWINGS

The present embodiments will hereinafter be described in conjunction with the following drawing figures, wherein like numerals denote like elements, and wherein:

FIGS. 1-8 illustrate the integrated circuit in cross sectional views during various stages of its fabrication.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure or process having additional functionality not described in detail herein. In particular, various processes in the manufacture of integrated circuits are well-known and so, in the interest of brevity, many conventional processes will only be mentioned briefly herein or will be omitted entirely without providing the well-known process details.

The exemplary embodiments taught herein relate to methods for fabricating integrated circuits including substrate contacts. During intermediate stages of the fabrication of an integrated circuit (IC), an interlayer dielectric (ILD) layer of insulating material is formed overlying a silicon-on-insulator (SOI) substrate including a device structure and an isolation structure. The device structure is disposed on a semiconductor layer of the SOI substrate and includes a metal silicide region. The isolation structure extends through the semiconductor layer to a buried insulator layer of the SOI substrate.

A patterned mask is used for etching through the ILD layer and forming both a device contact opening that exposes the metal silicide region and a substrate contact opening that exposes the isolation structure. In an exemplary embodiment, the pattern mask includes a device contact pattern and a substrate contact pattern that are arranged in a patterned photoresist mask layer, a patterned hard mask layer, or a combination of the patterned photoresist mask and patterned hard mask layers. The patterned mask is used as an etch mask for transferring the device contact pattern and the substrate contact pattern to the ILD layer to define the device contact opening and the substrate contact opening, respectively.

A device contact is formed in the device contact opening and is electrically coupled to the metal silicide region. The isolation structure and the underlying buried insulator layer are etched through to extend the substrate contact opening to a support substrate of the SOI substrate. A substrate contact is formed in the substrate contact opening and is electrically coupled to the support substrate.

In an exemplary embodiment, by using the patterned mask (e.g., single or multiple layer patterned mask) to etch and contemporaneously form, at least in part, both the device contact opening for the device contact and the substrate contact opening for the substrate contact, fewer etching masks, etching and/or deposition processes are needed to form the substrate contact as compared to conventional IC manufacturing approaches. Accordingly, integrated circuits including SOI substrates can be fabricated with reduced manufacturing complexity and/or enhanced manufacturing efficiency for forming substrate contacts.

Figure 4:
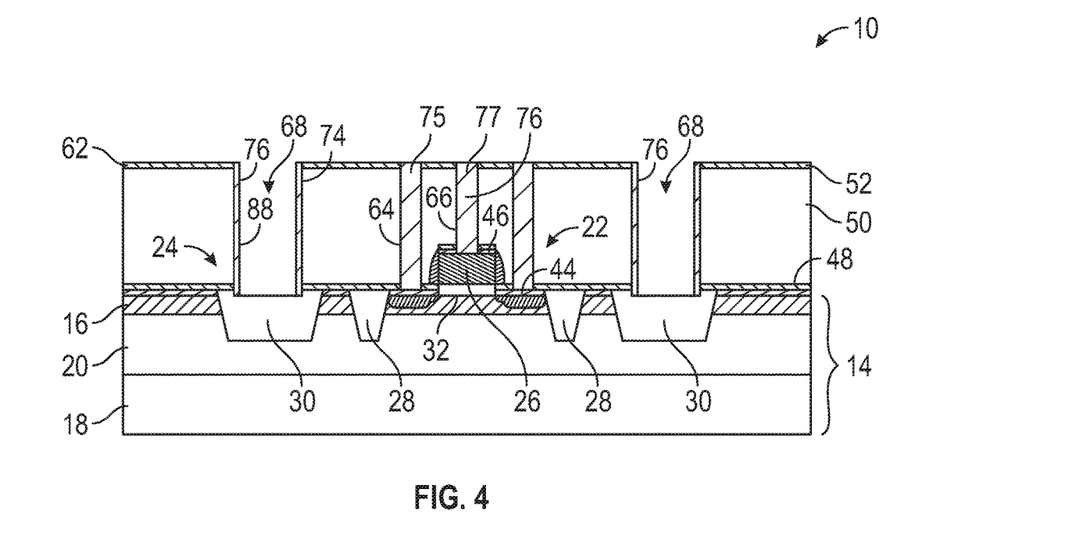
Figure 5:
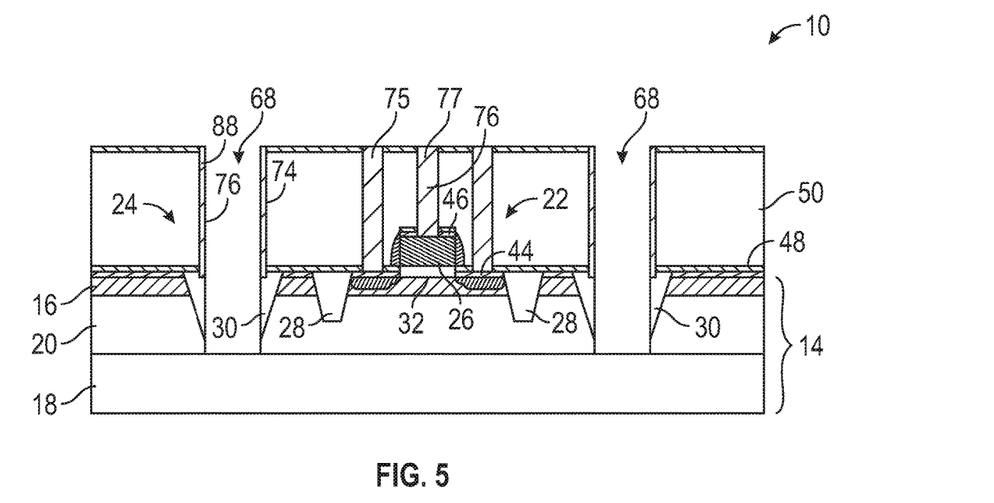
Figure 6:
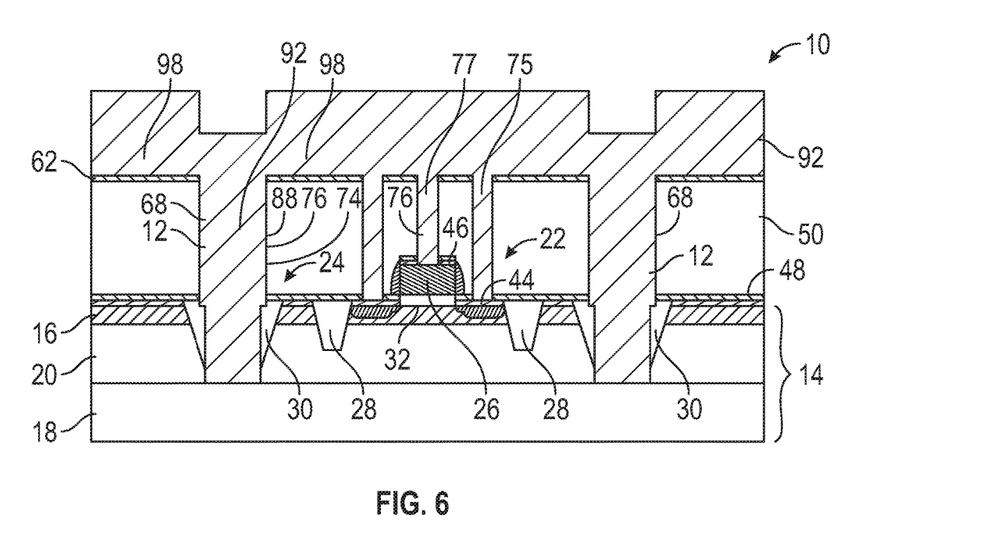
Figure 7:
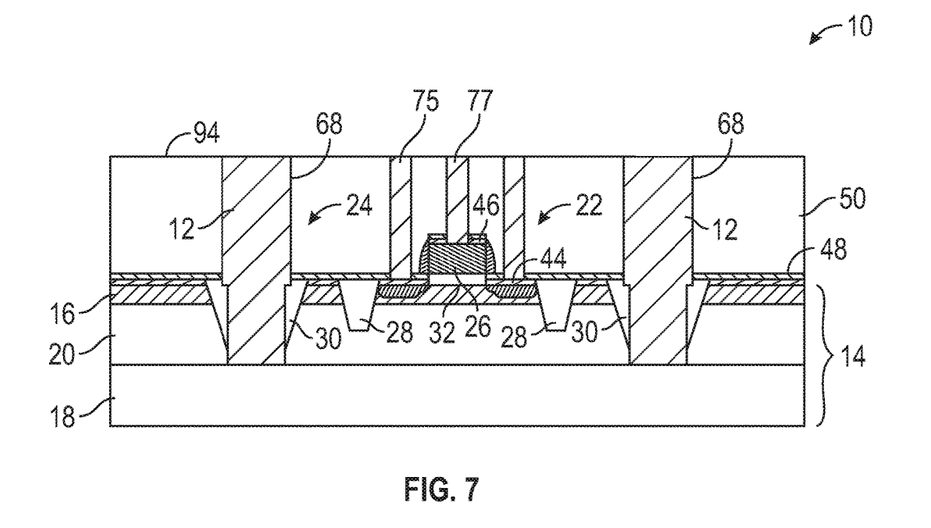
Figure 8:
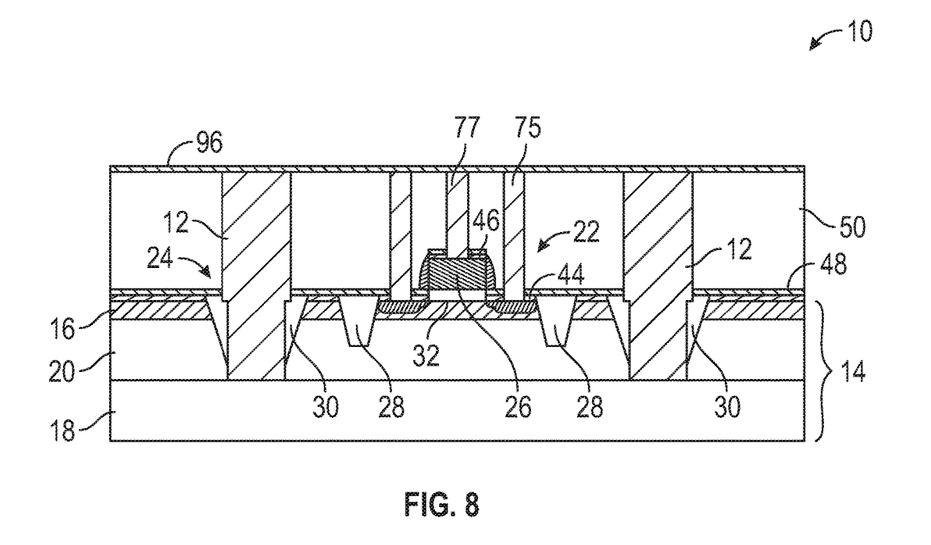

FIGS. 1-8 illustrate methods for fabricating an IC 10 including forming a substrate contact 12 in accordance with various embodiments. The illustrated portion of the IC 10 at later stages of fabrication as shown in FIGS. 6-8 includes two substrate contacts 12, although those of ordinary skill in the art will recognize that an actual IC could include a single substrate contact or more than two substrate contacts.

Figure 1:
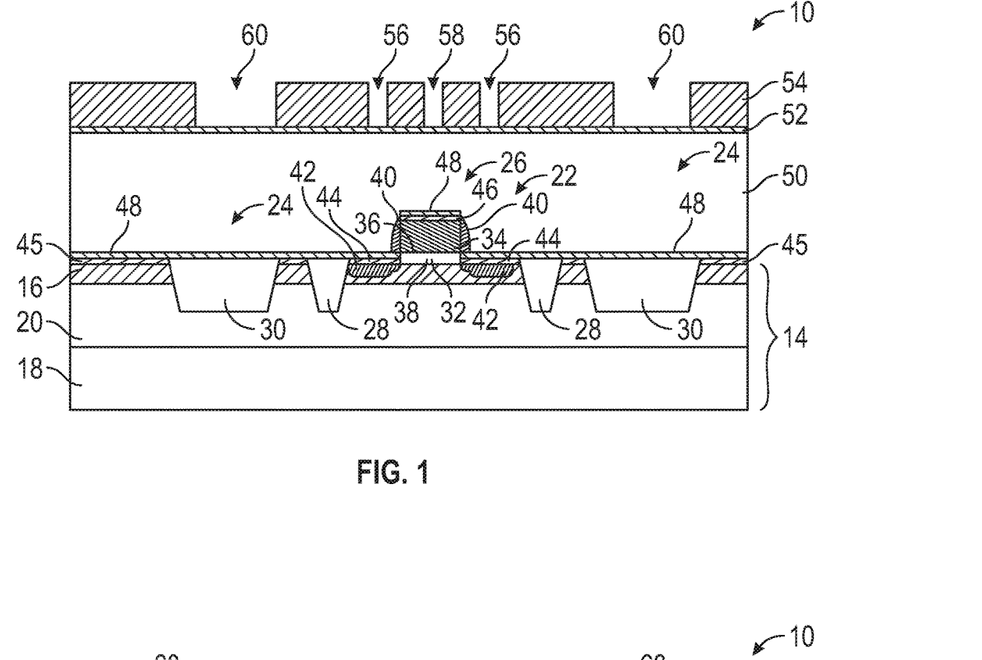
FIGS. 1-8 illustrate methods for fabricating integrated circuits having substrate contacts in accordance with various embodiments.

FIG. 1 illustrates, in cross sectional view, a portion of the IC 10 at an intermediate stage of fabrication in accordance with an exemplary embodiment. The illustrated portion includes an SOI substrate 14. The SOI substrate 14 has a semiconductor layer 16, a support substrate 18 (e.g., silicon substrate, silicon wafer, and/or carrier wafer), and a buried insulator layer 20 that is disposed between the semiconductor layer 16 and the support substrate 18. The semiconductor layer 16 is formed of a semiconductor material. As used herein, the term "semiconductor material" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 1 weight percent or more based on the total weight of the material unless otherwise indicated. In many embodiments, the semiconductor layer 16 primarily includes a monocrystalline semiconductor material. The support substrate 18 may be formed of a substantially crystalline silicon substrate material that may be doped or undoped in accordance with device requirements. The buried insulator layer 20 separates the semiconductor layer 16 and the support substrate 18 and is formed of an insulating material, such as silicon dioxide or the like.

The SOI substrate 14 includes region 22 and regions 24 that may be directly adjacent to or spaced apart from each other. In an exemplary embodiment, the region 22 is a device region that includes a device structure 26, shown as a transistor 26, that is formed in and on the semiconductor layer 16. The regions 24, for example, are areas designated for forming the substrate contacts 12 as will discussed in further detail below. It is understood that the SOI substrate 14 may include other numbers of regions 22 and 24 and various types of regions (not shown). For example, the SOI substrate 14 may include other device regions for other types of device structures.

In an exemplary embodiment, isolation structures 28 and 30 are provided in the SOI substrate 14. The isolation structures 28 and 30 are, for example, shallow trench isolation (STI) regions. As illustrated, the isolation structures 28 and 30 extend through the semiconductor layer 16 to the buried insulator layer 20. In the region 22, the isolation structures 28 define a corresponding active region 32, which is to be understood as a semiconductor region(s) having a doped region formed therein and/or receiving an appropriate dopant profile as required for forming a transistor element. In one example, the active region 32 corresponds to active regions of the transistor 26 that represent an N-channel transistor (NFET), or alternatively, a P-channel transistor (PFET). The isolation structures 30 in the regions 24, for example, may be wider than the isolation structures 28 in the region 22.

The transistor 26 includes a gate electrode structure 34. The gate electrode structure 34 may include electrode material(s), such as polysilicon, silicon-germanium, metal-containing materials and the like. A gate insulating layer 36 separates the gate electrode structure 34 from a channel region 38, which is formed in the semiconductor layer 16. The transistor 26 includes sidewall spacers 40 that are formed along sides of the gate electrode structure 34. Source and drain regions 42 are formed in the semiconductor layer 16 laterally adjacent to the channel region 38 under the gate electrode structure 34.

Metal silicide regions 44 and 46 are formed in the transistor 26. As illustrated, the metal silicide regions 44 are formed in the semiconductor layer 16 laterally offset from the channel region 38, and the metal silicide region 46 is formed overlying the gate electrode structure 34. As used herein, the term "overlying" means "over" such that an intervening layer may lie between the metal silicide region 46 and the gate electrode structure 34, or "on" such that the metal silicide region 46 physically contacts the gate electrode structure 34. The metal silicide regions 44 are used for forming device contacts with the source and drain regions 42 of the transistor 26 and the metal silicide region 46 is used to form a device contact with the gate electrode structure 34 as described in further detail below. In the region 24, metal silicide regions 45 are formed in and/or on the semiconductor layer 16 laterally adjacent to the isolation structures 30.

A dielectric etch stop layer 48 is disposed in the regions 22 and 24 overlying the metal silicide regions 44, 45, and 46 and the isolation structures 28 and 30. As discussed further below, overlying the dielectric etch stop layer 48 is an interlayer dielectric (ILD) layer 50 of insulating material. The dielectric etch stop layer 48 may be a nitride layer, such as a single layer of silicon nitride, a dielectric stack having for example oxyntride (SiON) and silicon nitride, or any other suitable type of etch stop layer that can be selectively removed from the ILD layer 50. The dielectric etch stop layer 48 facilitates forming the device and substrate contacts as will be described in further detail below. In an exemplary embodiment, the dielectric etch stop layer 48 may also serve as a stress layer for applying a stress on the channel region 38 of the transistor 26 to improve performance.

The ILD layer 50 is formed of a layer(s) of insulating material, for example, a silicon oxide layer. In one embodiment, the insulating material is a high aspect ratio process (HARP) dielectric material. Other suitable types of dielectric materials may also be used. For example, the ILD layer 50 can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). In an exemplary embodiment, the ILD layer 50 is capable of being selectively etched or patterned with respect to the dielectric etch stop layer 48.

As illustrated, a nitride layer 52 (e.g., layer of silicon nitride, dielectic stack of SiON and silicon nitride, or the like) is disposed over the ILD layer 50. A photoresist layer that has been patterned to define a patterned photoresist mask layer 54 overlies the ILD and nitride layers 50 and 52. In an exemplary embodiment, the patterned photoresist mask layer 54 includes device contact patterns 56 and 58 and substrate contact patterns 60. The device contact patterns 56 and 58 overlie and are aligned with the metal silicide regions 44 and 46, respectively, of the transistor 26. The substrate contact patterns 60 overlie and are aligned with the isolation structures 30.

The IC 10 as shown in FIG. 1 may be formed on the basis of the following exemplary processes. After providing the SOI substrate 14, the isolation structures 28 and 30 are formed using lithography, etch, deposition, planarization techniques and the like. Next, the basic doping of the active region 32 is established, for instance, by ion implantation. The process continues by forming the gate insulating layer 36 and the gate electrode structure 34 on the basis of oxidation and/or deposition techniques followed by the deposition of a gate electrode material that is patterned using lithography and etch techniques. The sidewall spacers 40 are formed along the gate electrode structures 34 on the basis of oxidation and/or deposition techniques. The sidewall spacers 40 are further defined in accordance with process and device requirements so as to act as an implantation mask, at least at various fabrication stages of the implantation sequences, to establish the desired vertical and lateral dopant profiles for the source and drain regions 42 and the desired offset to the channel region 38. It should be appreciated that respective implantation processes may be performed differently for transistors of different conductivity types. That is, respective resist masks may be provided prior to a specific ion implantation process to prevent unwanted dopant species from being introduced into specific transistor elements. For example, a P-type dopant may be introduced into the active region(s) of an N-channel transistor(s), while a respective P-channel transistor(s) is covered by a resist mask. Thereafter, one or more annealing processes may be performed to activate the dopants.

The process continues by forming the metal silicide regions 44, 45, and 46 by depositing a refractory metal, such as, for example, cobalt, nickel, titanium, tantalum, platinum, palladium, and/or rhodium, and subsequently performing one or more heat treatments to initiate a chemical reaction to form metal silicide. After the formation of metal silicide regions 44, 45, and 46, the dielectric etch stop layer 48 is deposited overlying the regions 22 and 24 followed by the deposition of the ILD layer 50 of insulating material (e.g., dielectric material such as silicon oxide) overlying the dielectric etch stop layer 48. In an exemplary embodiment, the ILD layer 50 is deposited by a low-pressure chemical vapor deposition (LPCVD) process. The ILD layer 50 is then planarized, for example, by a chemical mechanical planarization (CMP) process. As discussed above, the nitride layer 52 is disposed over the ILD layer 50 and the patterned photoresist mask layer 54 is formed overlying the nitride layer 52. The patterned photoresist mask layer 54 may be formed by depositing the photoresist layer using a well-known deposition technique, e.g., a spin coating process or the like. The photoresist layer is then patterned, for example, using a well-known lithographic technique, e.g., an ultraviolet (UV) lithographic process, a deep ultraviolet (DUV) lithographic process, an extreme ultraviolet (EUV) lithographic process or the like, to form the patterned photoresist mask layer 54.

Figure 2:
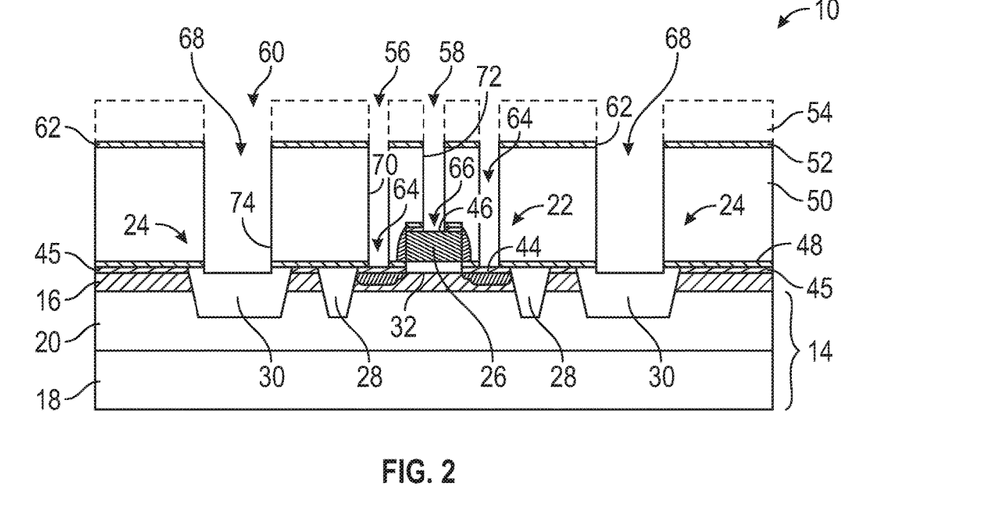

Referring to FIGS. 1-2, in an exemplary embodiment, using the patterned photoresist mask layer 54, the device contact patterns 56 and 58 and the substrate contact patterns 60 are transferred to the nitride layer 52 via an etching process to form a patterned hard mask layer 62. The process continues by using the patterned photoresist mask layer 54, the patterned hard mask layer 62, or a combination of the patterned mask layers 54 and 62 as a patterned mask for etching through the ILD layer 50 and the dielectric etch stop layer 48 to transfer the device and substrate contact patterns 56, 58, and 60 into the layers 50 and 48, forming device contact openings 64 and 66 and substrate contact openings 68, respectively. As illustrated, the device contact openings 64 and 66 extend through the ILD layer 50 and the dielectric etch stop layer 48 to expose the metal silicide regions 44 and 46. Likewise, the substrate contact openings 68 extend through the ILD layer 50 and the dielectric etch stop layer 48 to expose the isolation structures 30.

In an exemplary embodiment, the device contact openings 64 and 66 and substrate contact openings 68 are formed by etching through the nitride layer 52, the ILD layer 50, and the dielectric etch stop layer 48 using one or more dry etching processes. In one example, the patterned photoresist layer 54 is used as an etch mask and sidewalls 70, 72, and 74 that define at least in part the device and substrate contact openings 64, 66, and 68 are formed by etching through the nitride layer 52 and the ILD layer 50 using a first dry etching process that stops on the dielectric etch stop layer 48. Next, a second dry etching process that is timed (e.g., timed dry etching process) is used to extend the sidewalls 70, 72, and 74 through the dielectric etch stop layer 48 to expose the metal silicide regions 44 and 46 and the isolation structures 30. In an exemplary embodiment, the one or more dry etching processes include a reactive ion etching process using, for example, a $CHF_3$, $CF_4$, or $SF_6$ chemistry. In another embodiment, a first etching process, such as a oxide etching process, e.g., reactive ion etching at conditions for selectively removing oxide material, is used to etch through the ILD layer 50 using the dielectric etch stop layer 48 as an etch stop. Next, the dielectric etch stop layer 48 can be etched using a second etching process, such as a nitride etching process, e.g., reactive ion etching at conditions for selectively removing nitride material.

Figure 3:
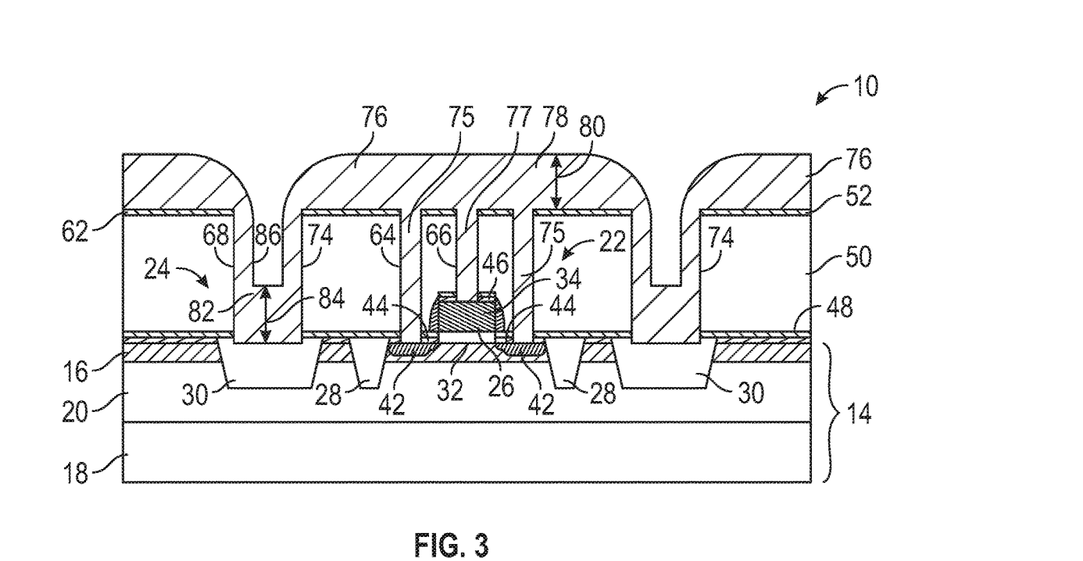

As illustrated, the widths of the substrate contact openings 68 may be greater than the widths of the device contact openings 64 and 66. In an exemplary embodiment, the process continues by removing the patterned photoresist mask layer 54 to expose the patterned hard mask layer 62. A conductive material 76 is deposited overlying the patterned hard mask layer 62 and the ILD layer 50 as shown in FIG. 3. In an exemplary embodiment, the conductive material 76 is deposited such that device contact openings 64 and 66 are filled with the conductive material 76 to form device contacts 75 and 77 and the substrate contact openings 68 are partially filled including substantially covering the sidewalls 74 with the conductive material 76. The conductive material 76 may be a conductive metal, such as tungsten, or any other conductive material known to those skilled in the art for forming contacts.

As illustrated, a layer section 78 of the conductive material 76 overlying the ILD layer 50 and the nitride layer 52 has a thickness (indicated by double headed arrow 80), and a layer section 82 of the conductive material 76 partially filling the substrate contact openings 68 has a thickness (indicated by double headed arrow 84). In an exemplary embodiment, the thicknesses 80 and 84 of the layer sections 78 and 82 of the conductive material 76 are about equal. In an exemplary embodiment, the thicknesses 80 and 84 of the layer sections 78 and 82 of the conductive material 76 are from about 2000 to about 4000 Å or may be thicker or thinner in other embodiments.

The device contacts 75 and 77 are electrically coupled to the metal silicide regions 44 and 46, respectively. In particular, in an exemplary embodiment, the device contacts 75 are electrically coupled to the metal silicide regions 44 that are in direct contact with the source and drain regions 42 of the transistor 26, and the device contact 75 is electrically coupled to the metal silicide region 46 that is in direct contact with the gate electrode structure 34 of the transistor 26.

Referring to FIGS. 3-4, the process continues by etching back the conductive material 76 to expose the isolation structures 30 in the substrate contact openings 68 while leaving the device contact openings 64 and 66 substantially filled with the conductive material 76 to keep the device contacts 75 and 77 substantially or fully intact. As illustrated, an overburdened portion of the conductive material 76 corresponding to the layer section 78 overlying the ILD and patterned hard mask layers 50 and 62 is removed to expose the patterned hard mask layer 62. Additionally, in the substrate contact openings 68, exposed portions 86 of the conductive material 76 along the sidewalls 74 are removed while leaving a remaining portion 88 of the conductive material 76 intact. In an exemplary embodiment, by having the thicknesses 80 and 84 of the layer sections 78 and 84 of the conductive material 76 about equal, portions of the conductive material 76 can be more effectively etched to remove the overburdened portion of the conductive material 76 overlying the ILD and patterned hard mask layers 50 and 62 and to expose the isolation structures 30 in the substrate contact openings 68 without over etching or substantially removing the conductive material 76 disposed in the device contact openings 64 and 66 that form the device contacts 75 and 77. The conductive material 76 may be etched back using a well-known dry or wet etching process. In an exemplary embodiment, a wet etching process is used to etch back the conductive material 76. In one example, the wet etching process uses a wet etchant such as $NH_4OH$: $H_2O_2$:$H_2O$ at about a 1:1.5:26 ratio at about 25 to about 60° C. for about 1 to about 10 minutes. In another example, the wet etching process uses a very dilute HCl solution at about room temperature.

The process continues as illustrated in FIG. 5 by using the patterned hard mask layer 62 as an etch mask for etching through the isolation structures 30 and the buried insulator layer 20 to extend the substrate contact openings 68 to the support substrate 18 of the SOI substrate 14. The insulation structure 30 and the buried insulator layer 20 may be etched using a well-known dry etching or wet etching process. In an exemplary embodiment, the isolation structures 30 and the buried insulator layer 20 are anisotropically etched using a dry etching process such as selectively reactive ion etching (RIE) at conditions for selectively removing oxide material over nitride material and conductive material such as tungsten or the like. As illustrated, upper surface portions of the support substrate 18 are exposed in the substrate contact openings 68.

Referring to FIG. 6, the process continues by forming the substrate contacts 12 in the substrate contact openings 68 such that the substrate contacts 12 are electrically coupled to the support substrate 18. In particular, in an exemplary embodiment, a conductive material 92 is deposited overlying the patterned hard mask layer 62 and the ILD layer 50 and in the substrate contact openings 68. The conductive material 92 fills the substrate contact openings 68 including covering the bottom of the openings 68 and the remaining portions 88 of the conductive material 76 overlying the sidewalls 74 to form the substrate contacts 12 electrically coupled to the substrate support 18. The conductive material 76 may be a conductive metal, such as tungsten, or any other conductive material known to those skilled in the art for forming contacts. Although not illustrated, the device contacts 75 and 77 and/or the substrate contacts 12 may include a liner/barrier layer(s), including a combination of layers, such as titanium (Ti), tantalum (Ta), ruthenium (Ru), titanium nitride (TiN), tantalum nitride (TaN), tungsten nitride (WN), and/or cobalt (Co) to line the bottom and sidewalls 70, 72, and 74 of the openings 64, 66, and 68 before depositing the conductive materials 76 and/or 92. As is well-known in the art, the liner-barrier prevents diffusion of the conductive material into the dielectric material layer and enhances adhesion of the conductive material to the walls of the contact openings 68.

Referring to FIGS. 6-7, an overburdened portion of the conductive material 92 and the patterned hard mask layer 62 overlying the ILD layer 50 are removed to expose a top surface 94 of the ILD layer 50, the substrate contacts 12, and the device contacts 75 and 77. In an exemplary embodiment, the overburdened portion 98 of the conductive material 92 and the patterned hard mask layer 62 are removed using a chemical mechanical planarization (CMP) process. The process continues as illustrated FIG. 8 by depositing a nitride layer 96 overlying the ILD layer 50, the substrate contacts 12, and the device contacts 75 and 77 to form a protective cap layer over the IC 10 for subsequent back-end-of-line (BEOL) processing.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method for fabricating an integrated circuit comprising:
    depositing an ILD layer of insulating material overlying a SOI substrate including a device structure and an isolation structure, wherein the device structure is disposed on a semiconductor layer of the SOI substrate and comprises a metal silicide region and the isolation structure extends through the semiconductor layer to a buried insulator layer of the SOI substrate;
    using a patterned mask for etching through the ILD layer and forming a device contact opening exposing the metal silicide region and a substrate contact opening exposing the isolation structure;
    forming a device contact in the device contact opening electrically coupled to the metal silicide region, wherein forming the device contact comprises:
        depositing a first conductive material overlying the ILD layer to fill the device contact opening and partially fill the substrate contact opening; and
        etching back the first conductive material to expose the isolation structure in the substrate contact opening while leaving the device contact opening substantially filled with the first conductive material to define the device contact that is electrically coupled to the metal silicide region;
    etching through the isolation structure and the buried insulator layer to extend the substrate contact opening to a support substrate of the SOI substrate; and
    forming a substrate contact in the substrate contact opening electrically coupled to the support substrate.

2. The method of claim 1, wherein a dielectric etch stop layer is disposed between the SOI substrate and the ILD layer overlying the metal silicide region and the isolation structure, and wherein using the patterned mask comprises etching through the dielectric etch stop layer after etching through the ILD layer to expose the metal silicide region in the device contact opening and to expose the isolation structure in the substrate contact opening.

3. The method of claim 2, wherein using the patterned mask comprises etching the ILD layer and the dielectric etch stop layer using one or more dry etching processes.

4. The method of claim 3, wherein etching through the dielectric etch stop layer comprises etching through the dielectric etch stop layer using a timed dry etching process.

5. The method of claim 1, wherein depositing the first conductive material comprises depositing the first conductive material overlying the ILD layer, and wherein the method further comprises removing an overburdened portion of the first conductive material overlying the ILD layer using a wet etching process.

6. The method of claim 1, wherein forming the substrate contact comprises depositing a second conductive material in the substrate contact opening to form the substrate contact electrically coupled to the support substrate.

7. The method of claim 6, wherein depositing the second conductive material comprises depositing the second conductive material overlying the ILD layer, and wherein the method further comprises removing an overburdened portion of the second conductive material overlying the ILD layer using a chemical mechanical planarization (CMP) process.

8. The method of claim 1, wherein etching through the isolation structure comprises etching through the isolation structure and the buried insulating layer to the support substrate of the SOI substrate using a dry etching process.

9. The method of claim 1, further comprising depositing a nitride layer overlying the ILD layer after forming the device and substrate contacts.

10. A method for fabricating an integrated circuit comprising:
    forming a patterned mask that overlies an ILD layer of insulating material and that comprises a device contact pattern and a substrate contact pattern, wherein the ILD layer overlies a SOI substrate that includes a device structure and an isolation structure, and wherein the device structure is disposed on a semiconductor layer of the SOI substrate and comprises a metal silicide region, and the isolation structure extends through the semiconductor layer to a buried insulator layer of the SOI substrate;
    using the patterned mask to form a device contact opening and a substrate contact opening extending through the ILD layer aligned with the device contact pattern and the substrate contact pattern, respectively, wherein the device contact opening exposes the metal silicide region and the substrate contact opening exposes the isolation structure;
    depositing a first conductive material overlying the ILD layer to fill the device contact opening and partially fill the substrate contact opening;
    etching back the first conductive material to expose the isolation structure in the substrate contact opening while leaving the device contact opening substantially filled with the first conductive material to define a device contact that is electrically coupled to the metal silicide region;
    etching through the isolation structure and the buried insulator layer to extend the substrate contact opening to a support substrate of the SOI substrate; and
    depositing a second conductive material overlying the ILD layer to fill the substrate contact opening and form a substrate contact that is electrically coupled to the support substrate.

11. The method of claim 10, wherein depositing the first conductive material comprises:
    depositing a first layer section of the first conductive material having a first thickness overlying the ILD layer; and partially filling the substrate contact opening with a second layer section of the first conductive material having a second thickness, wherein the first and second thicknesses are about equal.

12. The method of claim 10, wherein depositing the first conductive material comprises;

depositing a first layer section of the first conductive material overlying the ILD layer and having a first thickness of from about 2000 to about 4000 Å; and partially filling the substrate contact opening with a second layer section of the first conductive material having a second thickness of from about 2000 to about 4000 Å.

13. The method of claim 10, wherein using the patterned mask comprises forming the substrate contact opening having an opening width of from about 0.3 to about 0.5 µm.

14. The method of claim 10, wherein etching back the first conductive material comprises etching back the first conductive material to expose the isolation structure in the substrate contact opening using a wet etching process.

15. The method of claim 10, wherein using the patterned mask comprises etching the ILD layer to form a sidewall at least partially defining the substrate contact opening, and wherein depositing the first conductive material comprises partially filling the substrate contact opening including covering the sidewall with the first conductive material.

16. The method of claim 15, wherein etching back the first conductive material comprises removing an exposed portion of the first conductive material along the sidewall while leaving a remaining portion of the first conductive material covering the sidewall.

17. The method of claim 16, wherein depositing the second conductive material comprises filling the substrate contact opening including covering the remaining portion of the first conductive material with the second conductive material to form the substrate contact.

18. The method of claim 10, wherein forming the patterned mask comprises:

depositing a nitride layer overlying the ILD layer;

depositing and patterning a photoresist layer overlying the nitride layer to form a patterned photoresist mask layer; and using the patterned photoresist mask layer for etching through the nitride layer to form a patterned hard mask layer, wherein the patterned mask comprises the patterned photoresist mask layer, the patterned hard mask layer, or a combination thereof.

19. The method of claim 18, wherein using the patterned mask comprises using the patterned photoresist mask layer for etching through the ILD layer, and wherein the method further comprises:

removing the patterned photoresist mask layer prior to depositing the first conductive material, and wherein etching through the isolation structure comprises etching through the isolation structure and the buried insulator layer using the patterned hard mask layer as an etch mask.

* * * * *